United States Patent
Yamazaki et al.

(10) Patent No.: US 6,171,961 B1
(45) Date of Patent: Jan. 9, 2001

(54) FABRICATION METHOD OF A SEMICONDUCTOR DEVICE

(75) Inventors: Shunpei Yamazaki, Tokyo; Hideomi Suzawa; Kunihiko Fukuchi, both of Kanagawa, all of (JP)

(73) Assignee: Semiconductor Energy Laboratory Co., Ltd., Kanagawa-ken (JP)

( * ) Notice: Under 35 U.S.C. 154(b), the term of this patent shall be extended for 0 days.

(21) Appl. No.: 08/965,624

(22) Filed: Nov. 6, 1997

(30) Foreign Application Priority Data

Nov. 7, 1996 (JP) .................................................. 8-311322
Nov. 13, 1996 (JP) .................................................. 8-317139

(51) Int. Cl.[7] ................................................ H01L 21/44
(52) U.S. Cl. .................... 438/688; 438/672; 438/664; 438/663; 438/660
(58) Field of Search ..................... 438/643, 646, 438/648, 660, 663, 664, 672; 458/688

(56) References Cited

U.S. PATENT DOCUMENTS

| | | | |
|---|---|---|---|
| 5,534,463 | * 7/1996 | Lee et al. | 438/643 |
| 5,830,786 | * 11/1998 | Zhang et al. | 438/163 |
| 5,843,843 | * 12/1998 | Lee et al. | 438/688 |
| 5,913,146 | * 6/1999 | Merchant et al. | 438/646 |

* cited by examiner

Primary Examiner—David Nelms
Assistant Examiner—Reneé R. Berry
(74) Attorney, Agent, or Firm—Fish & Richardson P.C.

(57) ABSTRACT

To form a wiring electrode having excellent contact function, in covering a contact hole formed in an insulating film, a film of a wiring material comprising aluminum or including aluminum as a major component is firstly formed and on top of the film, a film having an element belonging to 12 through 15 groups as a major component is formed and by carrying out a heating treatment at 400° C. for 0.5 through 2 hr in an atmosphere including hydrogen, the wiring material is provided with fluidity and firm contact is realized.

53 Claims, 5 Drawing Sheets

FABRICATION METHOD OF A SEMICONDUCTOR DEVICE

BACKGROUND OF THE INVENTION

1. Field of the Invention

The present invention disclosed in the specification relates to a method of fabricating a semiconductor device having a wiring electrode comprising aluminum or including aluminum as a major component.

2. Description of the Related Art

In recent years, a necessity of fabricating several millions of large amount of semiconductor devices on one chip or on the same substrate has been enhanced with high density integration of device elements. The problem in fabricating large amount of semiconductor devices is the fabrication yield and operational failure of semiconductor devices considerably lowers the fabrication yield. As one of major causes of operational failure of semiconductor devices, contact failure is pointed out.

Contact failure is an operational failure caused when connection failure occurs at a portion of electrically connecting a wiring electrode and a semiconductor device (hereafter, referred to as contact). Particularly, the contact failure poses a serious problem in view of enhanced necessity of making electrical connection via a slender perforation (contact hole) by the miniaturizing technology and the multi layer wiring technology.

The causes of contact failure are grossly classified into three. The first cause is that a conductive film forming a wiring electrode and a source/drain region (semiconductor film) or a lead out electrode (conductive film) are not brought into ohmic contact with each other. This is due to the fact that an insulating coating, for example, a metal oxide or the like is formed on a contact face.

The second cause is that the coverage of a conductive film forming a wiring electrode is poor and disconnection is caused in a contact hole. In this case, improvement must be achieved by film forming method or film forming condition of the wiring electrode.

Further, the third cause is disconnection of a wiring electrode caused by the sectional shape of a contact hole or the like. The sectional shape of a contact hole is strongly dependent on etching conditions of an insulating material (SiN, $SiO_2$, organic resin film or the like) covered on the contact portion.

Particularly, contact failure due to the second or the third cause is actualized with a higher aspect ratio of a contact hole by miniaturizing a semiconductor device.

It is an object of the present invention disclosed in the specification to reduce operational failure of a semiconductor device caused by contact failure by resolving the above-described problem. Particularly, it is an object of the present invention to provide the technology of eliminating contact failure when a material comprising aluminum or including aluminum as a major component is used as a wiring electrode.

Further, it is an object of the present invention to provide the technology of realizing a semiconductor device or an electro-optic device having high long period reliability by improving reliability of contact. Further, it is an object thereof to promote the yield of the fabrication steps.

SUMMARY OF THE INVENTION

According to an aspect of the present invention, there is provided a method of fabricating a semiconductor device having a structure having a conductive material and an insulating film formed on the conductive material comprising at least a step of forming a contact hole on the insulating film and exposing the conductive material at a bottom thereof, a step of forming a wiring material comprising aluminum or including aluminum as a major component which is brought into electrical contact with the conductive material at least at the bottom of the contact hole, a step of forming a film including an element belonging to 12 through 15 groups as a major component on a surface of the wiring material, and a step of fluidizing the wiring material by a heating treatment wherein the heating treatment is carried out at a temperature of 400° C. or lower in an atmosphere including hydrogen.

The present invention is constituted by the technology (referred to as reflow technology) improving the coverage in respect of a contact hole by lowering temperatures of fluidizing a wiring material by adding an element belonging to 12 through 15 groups to the wiring material comprising aluminum (Al) or including aluminum as a major component and fluidizing the wiring material by a heating treatment.

Further, the most significant characteristic resides in that the reflow step can be executed at temperatures of 450° C. or lower, preferably 400° C. or lower (representatively 350 through 400° C.) by performing the heating treatment in an atmosphere including hydrogen. Also, the inventors predict that a reflow operation can be performed even at temperatures lower than 350° C. by optimizing conditions.

The temperature of 350° C. is a temperature that is frequently used in hydrogenation, which is recognized as a temperature preventing an aluminum wiring from causing hillocks. Further, the temperature of 400° C. or lower is extremely important in reducing or preventing thermal deterioration of wirings formed on other layers or insulating films (for example, organic resin film).

Further, according to the constitution of the present invention, by constituting a structure sandwiching a conductive film of a titanium (Ti) film or the like between the conductive material and the material comprising aluminum or including aluminum as a major component, excellent ohmic contact can be secured.

Further, as the conductive material, material comprising aluminum or including aluminum as a major component (for example, material for forming wirings or the like) or a conductive semiconductor material (for example, semiconductor material for forming source/drain region of transistor) is representatively pointed out. Naturally, metals such as tantalum, tungsten and the like and titanium silicide and the like are also included in the conductive material.

Further, as an element belonging to 12 through 15 groups utilized as a catalyst in the reflow step, one or a plurality of elements selected from the group consisting of Germanium (Ge), Tin (Sn), Gallium (Ga), Lead (Pb), Zinc (Zn), Indium (In) and Antimony (Sb) are effective.

BRIEF DESCRIPTION THE DRAWINGS

FIGS. 1(A) and 1(B) are photographs for explaining sectional shapes of a thin film;

FIGS. 2(A), 2(B), 2(C) and 2(D) are views showing fabrication steps of a semiconductor device;

Figure 5A:
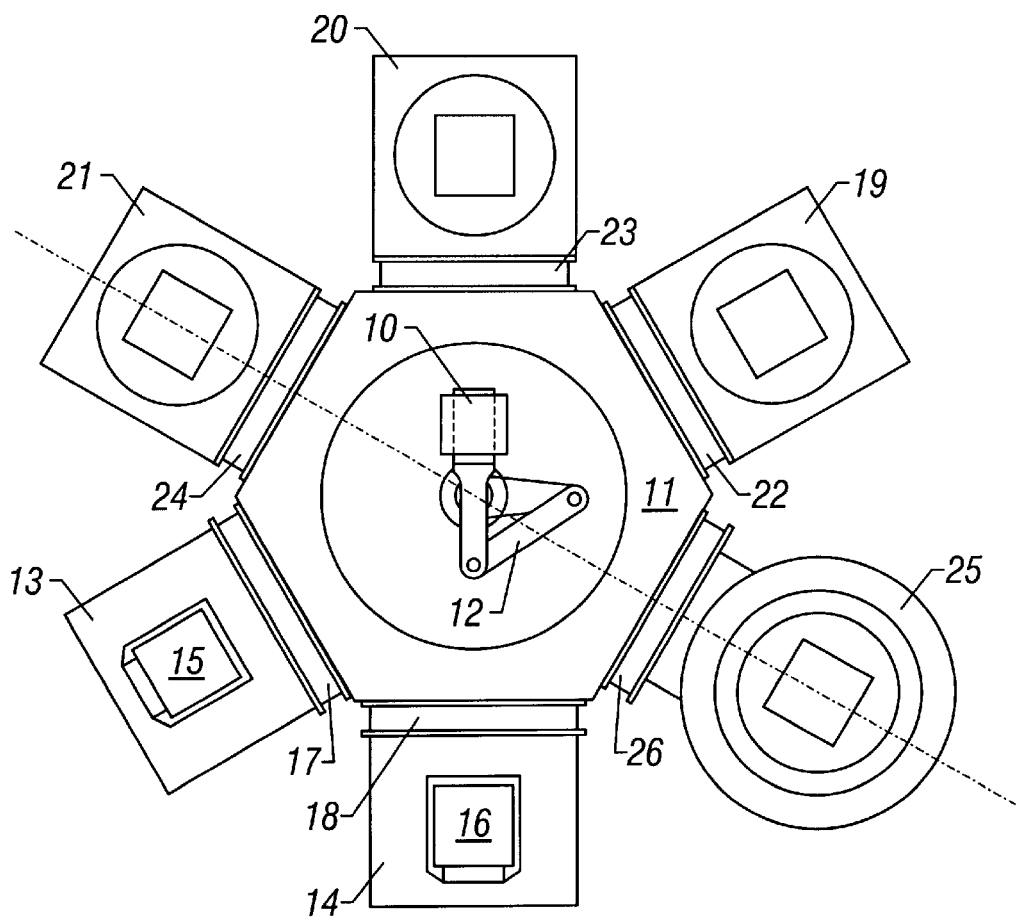
Figure 5B:
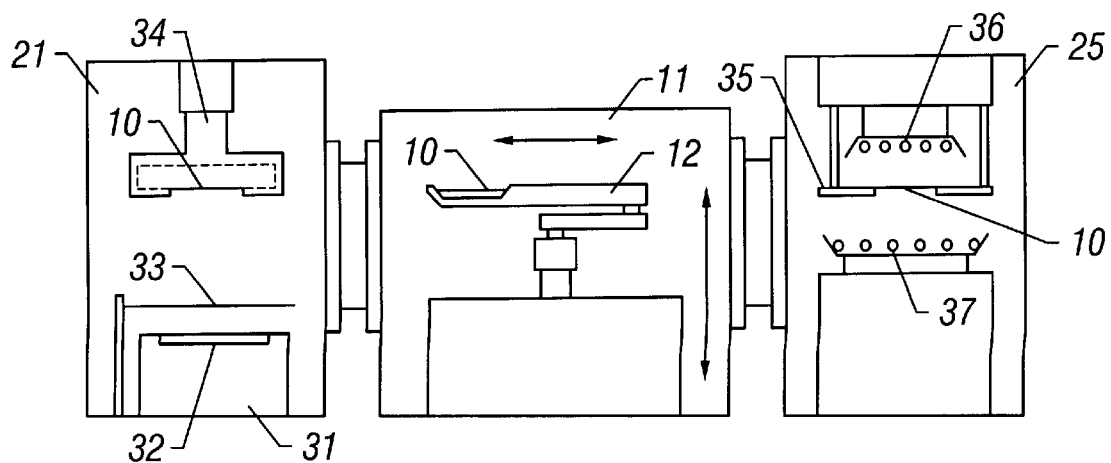

FIGS. 5(A) and 5(B) are views showing a film forming device of a multi chamber type; and FIGS. 6(A), 6(B), 6(C), 6(D), 6(E) and 6(F) are views showing semiconductor devices as applied products.

DETAILED DESCRIPTION OF THE PREFERRED EMBODIMENT

A contact hole is formed in respect of an insulating film formed on a conductive material and a titanium film is formed to cover the contact hole. Then, a wiring material comprising aluminum or including aluminum as a major component is laminated on the titanium film.

Furthermore, after forming the wiring material, a film including an element belonging to 12 through 15 groups as a major component is laminated preferably without being opened to an atmosphere.

Further, a heating treatment at 400° C. (representatively, 350 through 400° C.) for 0.5 through 2 hr is carried out in an atmosphere including hydrogen by which the wiring material is fluidized (reflowed). The fluidized wiring material covers the contact hole by flowing into the contact hole and therefore, even if disconnection failure or the like is caused in the film forming operation, the failure can be improved by the reflow step.

[Embodiment 1]

Figure 1A:
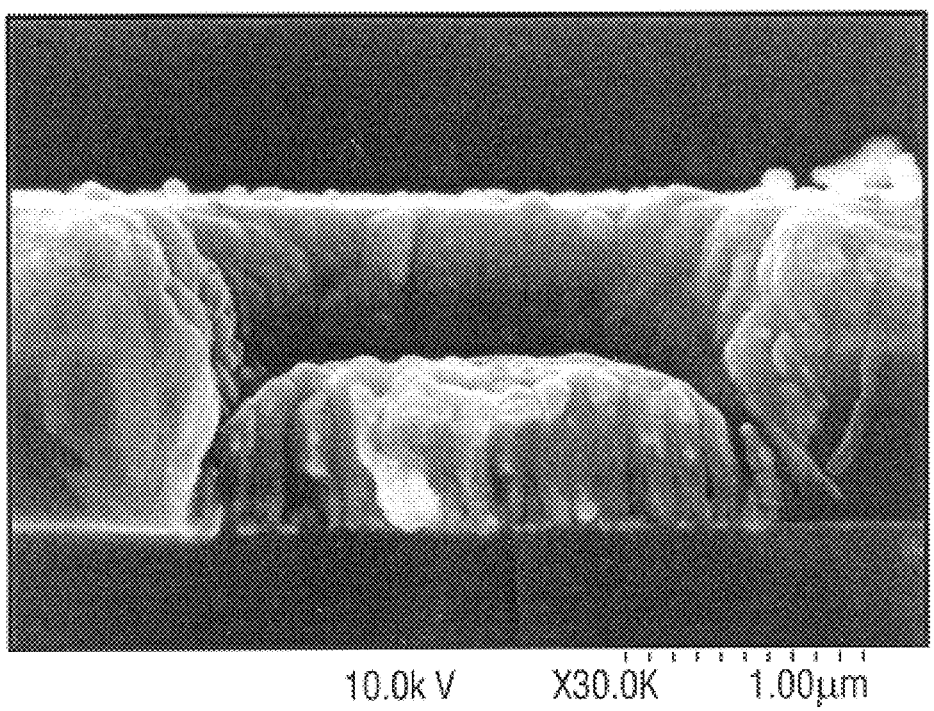
Figure 1B:
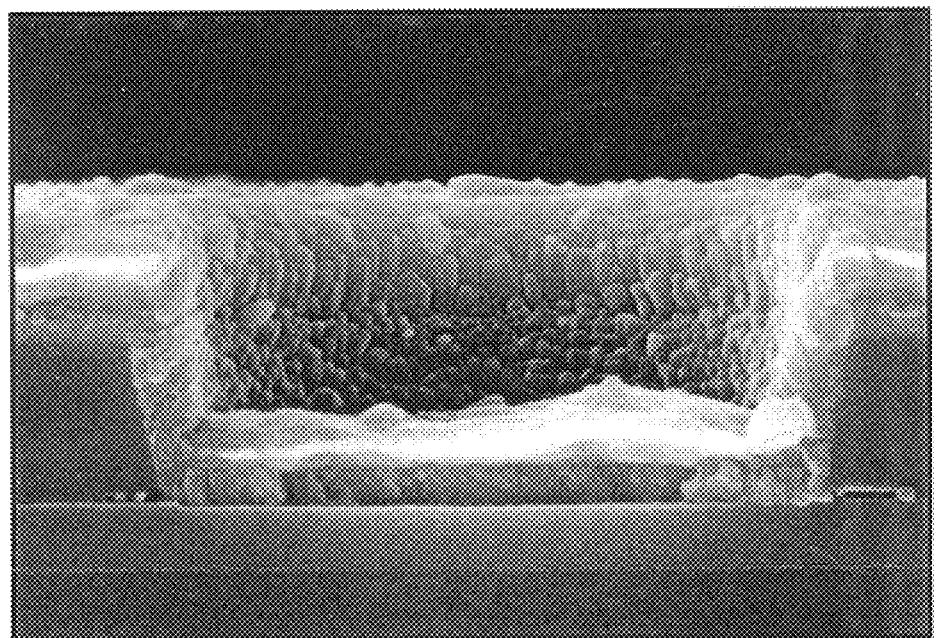

According to the embodiment, the effect of the reflow step by the present invention will be shown by experimental results. FIGS. 1(A) and 1(B) show sections at inside of a contact hole where an inner diameter of the contact hole is about 2 µm and a thickness of an interlayer insulating film is about 0.8 µm. Further, the wiring structure embedding the contact hole is constituted by layers of Ti(1000 Å)/Al—Si (5000 Å)/Sn(50 Å) in this order from lower layers.

The wiring material (Al—Si) is thickly formed to fabricate a sample capable of confirming the reflow effect further significantly. Also, formation of the wiring comprising a three layers structure is conducted continuously by using a sputtering device of a multi chamber type shown by FIGS. 5(A) and 5(B).

After forming the above-described wiring structure, the reflow processing were performed by executing a heating treatment of the present invention at 400° C. for 2 hr. FIGS. 1(A) and 1(B) are formed by observing the section of the contact hole by an SEM (Scanning Electron Microscope) in respect of a substrate under the following conditions.

(A) initial state before the reflow step (B) a state after the reflow step at 400° C. for 2 hr. in an atmosphere of 100% hydrogen.

Firstly, FIG. 1(A) shows the section of the contact hole at the initial state before the reflow step and in this state, disconnection failure of the wiring material is confirmed at the bottom of the contact hole (region at a vicinity of a side wall of the hole).

Next, FIG. 1(B) shows the section of the contact hole after performing the reflow step at 400° C. for 2 hr. in an atmosphere of 100% hydrogen. As is apparent in FIG. 1(B), it can be confirmed that the shape of the wiring is gently sloping by being made uniform and the contact state of the wiring material at inside of the contact hole is extremely improved.

As described above, when FIGS. 1(A) and 1(B) are compared with each other, it can be understood that the reflow step of the present invention is clearly an effective technology in improving disconnection failure of the wiring at inside of the contact hole. Further, the fact that the reflow step can be carried out at a temperature of 400° C., has very important significance in widening the width of selecting an insulating film which can be used in a multi layer wiring structure.

Incidentally, although the reason of expediting the fluidization of the wiring is not clearly known when the reflow step is performed under a hydrogen atmosphere, the inventors predict that natural oxides formed on the surface of the wiring (or film for constituting catalyst) are removed to a degree whereby the fluidization of the wiring material is not hampered, owing to the reduction effect of hydrogen.

[Embodiment 2]

According to the embodiment, an example of forming a wiring electrode of a thin film transistor (TFT) by using the reflow technology according to the present invention will be described. An explanation will be given thereof in reference to FIGS. 2(A), 2(B), 2(C) and 2(D).

Figure 2A:
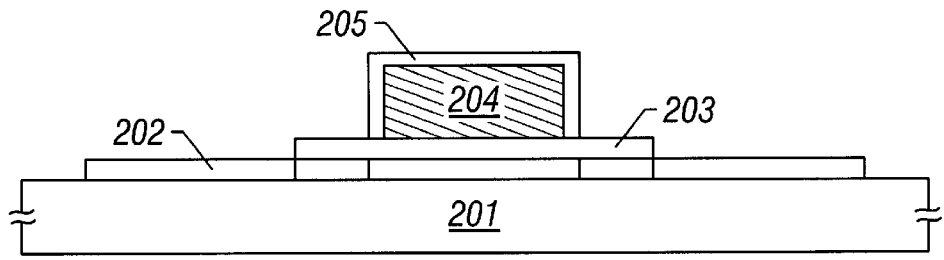

In FIG. 2(A), numeral 201 designates a substrate having an insulating surface and in this embodiment, a silicon oxide film is piled on a glass substrate. On top thereof, an activation layer 202 provided by patterning a crystalline silicon film is arranged. The crystalline silicon film may directly be formed or formed by crystallizing an amorphous silicon film.

Further, numeral 203 designates a gate insulating film comprising a silicon oxide film and numeral 204 designates a gate electrode including aluminum as a major component. Numeral 205 designates an anodized film obtained by anodically oxidizing the gate electrode 204 for protecting the gate electrode 204.

Next, when the state of FIG. 2(A) is provided, impurity ions (phosphorus or boron) for providing conductive performance are added to the activation layer 202 in two steps. By these steps, a source region 206, a drain region 207, low concentration impurity regions 208 and 209 and a channel forming region 210 are formed. Especially, the low concentration impurity region 209 is referred to as an LDD (Lightly Doped Drain) region.

The technology described in Japanese Unexamined Patent Publication Number JP-A-7-135318 by the inventors is utilized in the above-described fabrication steps. Details thereof will be known by referring to the publication.

Next, a permeable organic resin material (polyimide in the embodiment) is formed as an interlayer insulating film 211 by a thickness of 1 µm. By using polyimide for the interlayer insulating film, an excellent flat face is obtained by absorbing stepped differences of wirings and the like. Accordingly, when the wiring material is reflowed in later steps, the film thickness is not extremely thinned at the stepped differences. Further, the reflow step is carried out at 400° C. or lower and therefore, polyimide is not deteriorated.

Further, a silicon nitride film or a silicon oxide film may be used as the interlayer insulating film 211. In that case, as the film forming method, the plasma CVD (Chemical Vapor Deposition) process or the low pressure thermal CVD process may be used. Incidentally, when the silicon nitride film is used, it is preferable to form a thin silicon oxide film at the lowermost layer to constitute an etching stopper in forming the contact hole in later steps.

Further, when the interlayer insulating film 211 has been formed, contact holes 212 are formed. In this embodiment, the contact holes are formed by the dry etching process. The dry etching process is a technology indispensable in miniaturization since a contact hole having a high aspect ratio can be formed by an etching process in use thereof.

Figure 2B:
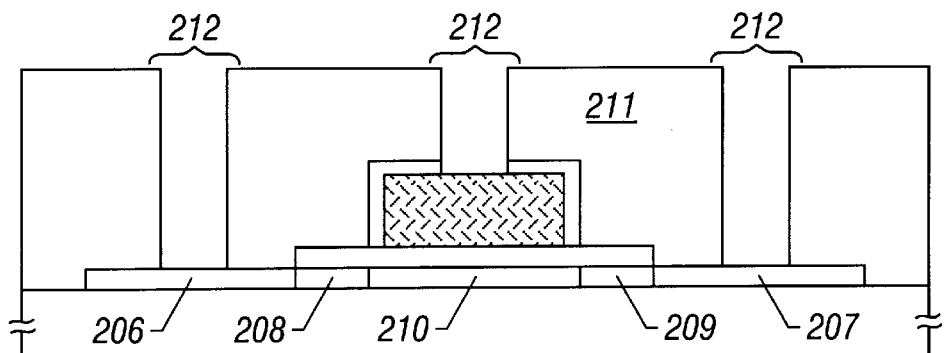

A state shown by FIG. 2(B) is provided by the above-described steps. When the state of FIG. 2(B) is obtained, a titanium film 213 is formed on the interlayer insulating film 211 by a thickness of 500 through 1000 Å. The titanium film 213 has an effect of making excellent the ohmic contact between TFT and a wiring electrode.

On top thereof, a wiring material 214 including aluminum as a major component (alloy of aluminum including scandium, silicon, copper or the like) is formed by a thickness of 3000 Å. Further, a metal film 215 constituted by an element belonging to 12 through 15 groups that is necessary in the later reflow step, is formed by a thickness of 50 through 100 Å. It is preferable that the laminated film is formed continuously. Further, the film forming method preferably uses CVD process or PVD (Physical Vapor Deposition) process.

Further, it is preferable that the oxygen concentration in the wiring material 214 is $5 \times 10^{19}$ atoms/cm$^3$ or lower, preferably, $1 \times 10^{19}$ atoms/cm$^3$ or lower (further preferably, $3 \times 10^{18}$ atoms/cm$^3$ or lower) to efficiently perform the later reflow step. The oxygen concentration is a value defined by a minimum value of measured values of SIMS (Secondary Ion Mass Spectrometry) analysis.

In the reflow step, oxides on the surface of aluminum constitute a factor for hampering fluidization and therefore, the fluidization of the wiring material may be hampered by the presence of oxygen. Accordingly, it is preferable to reduce as less as possible oxygen included in the wiring material. For that purpose, it is preferable to perform the film formation of the wiring material 214 in chambers which are cleaned to ultra high vacuum.

Further, one or a plurality of kinds of elements constituting the metal film 215 selected from the group consisting Ge, Sn, Ga, Zn, Pb, In and Sb can be used. According to dual phase diagrams of alloys comprising these elements and aluminum, it is known that these elements function as catalyst elements for lowering a melting point (strictly speaking, fluidizing temperature) of aluminum. Further, it is not necessary that the metal film 215 is constituted by a single layer but may have a mode of, for example, a laminated layer of Germanium and Tin.

Figure 2C:
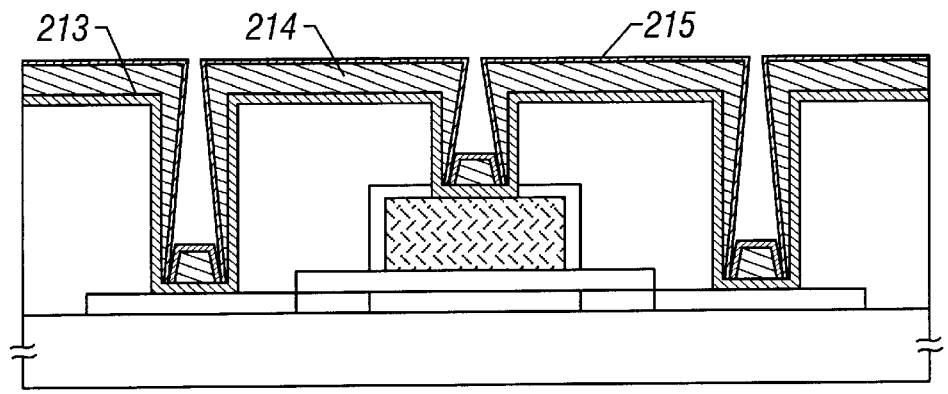

A state at a time point where the laminated film constituted by the above-described structure is formed is shown by FIG. 2(C). At this moment, as shown by FIG. 2(C), since the aspect ratio of the contact hole 212 is high, the wiring material is difficult to form at the inside (particularly, side wall) of the contact hole. Therefore, there is high probability of causing disconnection failure at the bottom of the contact hole.

Hence, the reflow step for providing the fluidity to the wiring material under this state is executed. The present invention is featured in that the reflow step is performed in a hydrogen atmosphere. Further, the processing temperature of the reflow step is 400° C. or lower (representatively, 350 through 400° C.) and the processing time is 0.5 through 2 hr. In this embodiment, the reflow step is carried out by a heating treatment at 400° C. for 1 hr in a hydrogen atmosphere.

The wiring material 214 is provided with fluidity by the reflow step and the wiring material 214 can cover effectively the inside of the contact hole. As a result, the wiring material 214 is formed on the side face of the contact hole 212 with a sufficient film thickness and disconnection failure of the bottom is improved.

Further, the reflow step according to the present invention is carried out at temperatures of 400° C. or lower and therefore, hillocks or whiskers can be restrained from occurring on the surface of the wiring material including aluminum as a major component. Furthermore, an effect of hydrogenating the activation layer can be expected in the reflow step.

Figure 2D:
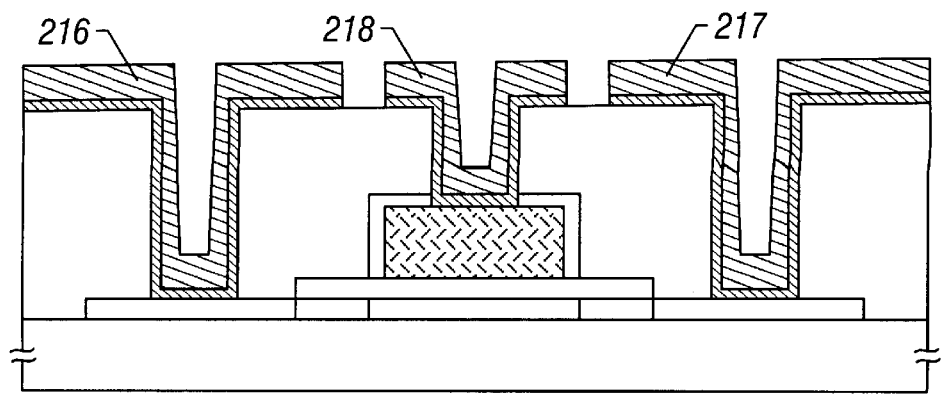

The wiring material provided by the above-described reflow step is patterned by which a source wiring 216, a drain wiring 217 and a gate wiring 218 are formed. Then, a total thereof is hydrogenated by which TFT having the structure shown by FIG. 2(D) is obtained.

Although an explanation has been given of a method of forming a planar type TFT according to the embodiment, the present invention can be carried out regardless of the structure of TFT. That is, the structure of TFT is not limited to the structure shown by FIG. 2(D) but even with, for example, inverse stagger type TFT or a structure having salicide structure, the present invention can easily be applied in accordance with the necessity of a person executing the present invention.

According to TFT formed by utilizing the present invention, the possibility of contact failure is significantly reduced and highly reliable operation is realized. The fabrication yield of TFT is considerably promoted by utilizing the present invention and therefore, economic merit is enormous.

[Embodiment 3]

This embodiment provides an example when the present invention is applied to a semiconductor device having a multi layer wiring structure. As an example thereof, FIG. 3 shows a structure when a permeable organic resin material is used as an interlayer insulating film.

Figure 3:
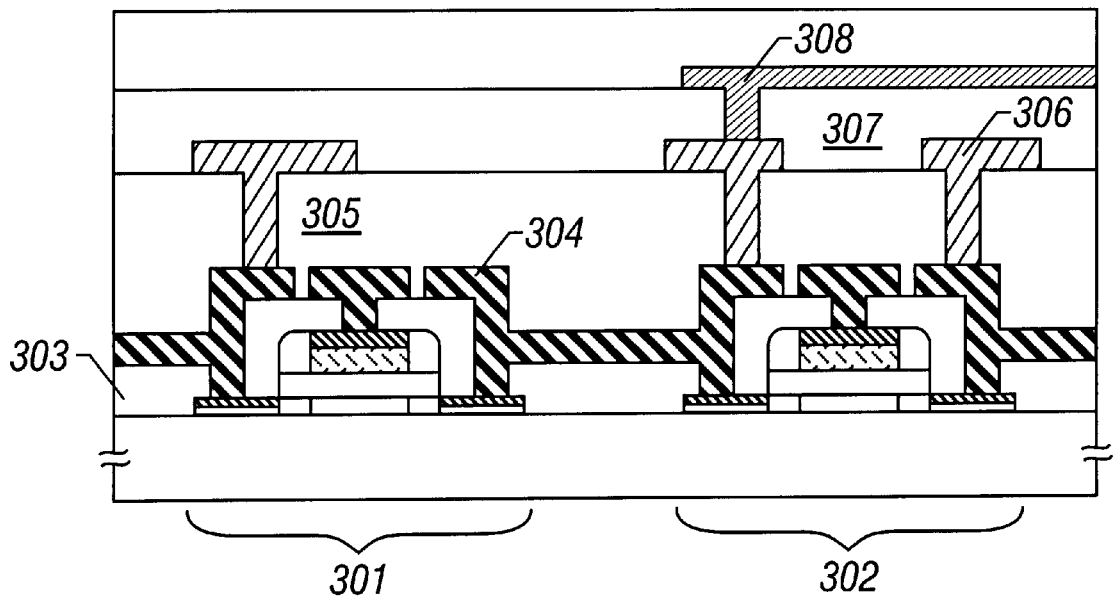
FIG. 3 is a view showing a structure of a semiconductor device.

FIG. 3 shows a CMOS (Complementary Metal Oxide Semiconductor) circuit where an N-channel type TFT 301 and a P-channel type TFT 302 are complementarily combined. The fabrication steps of TFT are based on publicly known technology and therefore, an explanation thereof will be omitted.

In FIG. 3, a first wiring 304 (including all wirings formed in the same layer) that is brought into direct contact with TFTs 301 and 302, is formed on a first interlayer insulating film 303. First, the present invention can be used when the first wiring 304 is formed.

Next, a permeable organic resin material is piled thereon as a second interlayer insulating film 305. Further, on top thereof, a second wiring 306 is formed. The present invention can be applied also to the second wiring 306. This has very important significance, Polyimide, polyamide, polyimide amide or the like is representative as a permeable organic resin material. When a permeable organic resin material is used as an interlayer insulating film, the film thickness can be easily increased since the film can be formed by the spinning process and further, the throughput can be promoted. Also, a parasitic capacitance among wirings can be reduced since the relative dielectric constant is low. However, due to the heat resistance of the permeable organic resin material, the maximum heating temperature after the film formation must be restricted to 450° C. or lower (preferably, 400° C. or lower).

However, according to the present invention, the wiring material can be reflowed at 400° C. or lower (representatively, 350 through 400° C.) and therefore, the reflow step can be carried out with no problem even when the permeable organic resin material is utilized as the interlayer insulating film.

Therefore, the permeable organic resin material is further used as a third interlayer insulating film 307 in FIG. 3 and a third wiring 308 is formed on top thereof by using the present invention, and yet it is possible to prevent the interlayer insulating films at lower layers from deteriorating by heat treatment.

Further, although the example of utilizing the permeable organic resin material as the interlayer insulating film is shown in the embodiment, the same is applicable to the case where a silicon oxide film, a silicon nitride film, a silicon oxinitride film or the like is used as the interlayer insulating film.

As mentioned above, by utilizing the present invention, a material having low heat resistance can be used as an interlayer insulating film whereby the design margin in designing device can be widened.

[Embodiment 4]

The present invention is applicable to an IGFET (Insulated Gate Field Effect Transistor) formed on a single crystal silicon substrate. Further, the present invention is applicable also to an SOI structure having a single crystal silicon as an activation layer.

Figure 4:
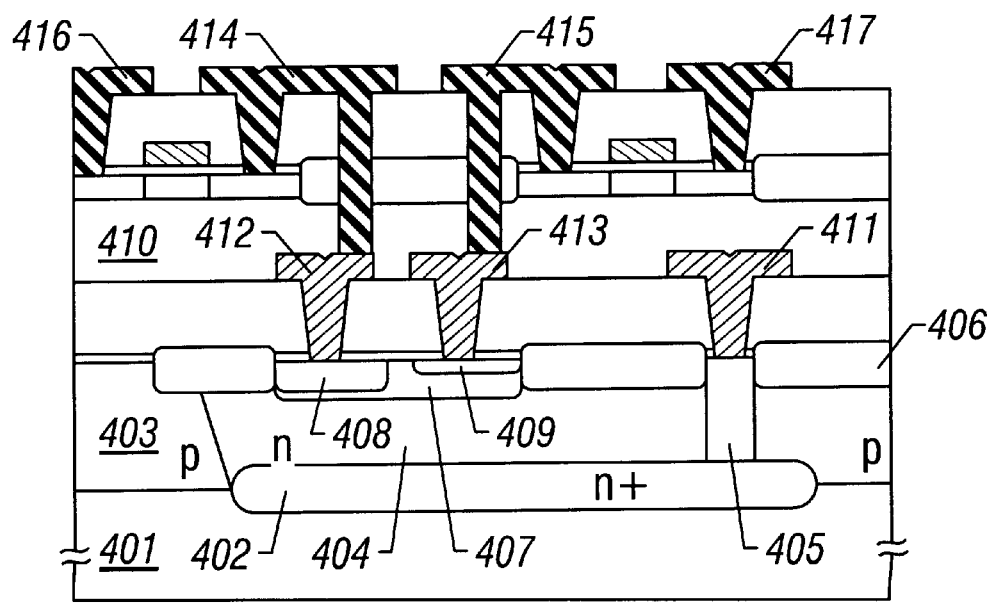
FIG. 4 is a view showing a structure of a semiconductor device.

FIG. 4 shows a structure as an example when a BiCMOS circuit is constituted as a semiconductor device of a three-dimensional multi layer structure using an SOI structure. In this case, a CMOS circuit where the lower layer is constituted by a bipolar transistor and the upper layer is constituted by a semiconductor device of an SOI structure, is shown.

In FIG. 4, numeral 401 designates a P-type silicon substrate, numeral 402 designates an embedded N+ region and numeral 403 designates a p well formed by epitaxial growth and a p well on the embedded N+ region 402 constitutes an n well 404 functioning as a collector by being reverted into N type. Further, numeral 405 designates a DeepN+ region for constituting a lead out electrode led from the embedded N+ region 402. Further, numeral 406 designates a field oxidized film formed by the normal selective oxidation process.

A p– region 407 is firstly formed at the n well 404 for constituting a bipolar transistor and successively, a p+ region 408 for constituting an external base and an n+ region 409 for constituting an emitter region are arranged.

Further, a collector electrode 411, a base electrode 412 and an emitter electrode 413 are formed by which the bipolar transistor is constituted. The present invention can be applied in forming these electrodes.

The CMOS circuit having the SOI structure in which a single crystal silicon layer provided by the wafer paste together technology is constituted as an activation layer, is formed on the bipolar transistor comprising the above-described constitution. An interlayer insulating film designated by numeral 410 includes a contact face (indicated by a dotted line). Here, a detailed explanation of the CMOS circuit will be omitted.

Further, by connecting the CMOS circuit and the bipolar transistor by wirings 414 and 415, the Bi-CMOS structure can be realized. In this case, the present invention is applicable to wirings 416 and 417 constituting the CMOS circuit, the wirings 414 and 415 for connecting the CMOS circuit and the bipolar transistor.

As mentioned above, even when the three-dimensional integrated circuit is constituted by utilizing the SOI structure, the reflow process can be carried out without deteriorating other wirings or interlayer insulating films and highly reliable contact can be realized. That is, the present invention is an extremely effective technology in fabricating a semiconductor device having a three-dimensional structure.

Further, although an example of constituting the BiCMOS circuit is shown in the embodiment, the present invention is applicable to not only the BiCMOS circuit but a logic circuit of a DRAM (Dynamic Random Access Memory) circuit, a SRAM (Static Random Access Memory) or the like and highly reliable VLSI (Very Large Semiconductor Integrated) circuits or ULSI (Ultra Large Semiconductor Integrated) circuits can be realized.

[Embodiment 5]

RTA (rapid thermal annealing) can be utilizing as a heating treatment for executing the reflow step according to the present invention.

RTA is an annealing process for irradiating intensified light of infrared ray, ultraviolet ray or the like by a lamp or the like. As the feature of this process, a temperature rise rate and a temperature drop rate are fast and treatment time is as short as several seconds through several tens seconds and therefore, only a thin film at the topmost surface can substantially be heated. That is, for example, only a thin film on a glass substrate can be annealed at an extremely high temperature of about 1000° C.

When the RTA technology described in the embodiment is applied, a heating treatment at temperatures exceeding the heat resistance of a gate electrode can be executed and therefore, the allowable range of the reflow temperature is widened. Accordingly, the width of selecting metal elements for utilizing in the reflow process can be widened.

Further, the RTA processing can be carried out in an extremely short time period of several seconds through several tens seconds and therefore, it is the effective means also in view of the productivity.

[Embodiment 6]

The present invention has the most significant feature in carrying out the reflow step in a hydrogen atmosphere and in carrying out a normal heating treatment, hydrogen is existed in a molecular state or an atomic state. The embodiment shows an example where hydrogen radical or hydrogen ion is used in the reflow step.

For that purpose, plasma is generated in a hydrogen atmosphere and the reflow process is carried out in an atmosphere of excited hydrogen. By utilizing hydrogen in an activated state by being made radical or ionized, the efficiency of the reflow process can be promoted.

Further, the embodiment can be combined with the RTA technology described in Embodiment 5. Thereby, further promotion of throughput can be expected.

[Embodiment 7]

This embodiment shows an example of using a film forming device having a multi chamber (cluster tool) structure having the constitution shown by FIGS. 5(A) and 5(B) in forming the laminated film constituting the wiring electrodes described in Embodiment 1 or Embodiment 2.

The film forming device having a multi chamber structure shown by FIGS. 5(A) and 5(B) is an example of a sputtering device capable of continuously laminating thin films having different compositions (including cases of different elements) at respective reaction chambers.

Here, an explanation will be given of a simple constitution of a sputtering device shown by FIG. 5(A). Numeral 10 designates a substrate to be processed, numeral 11 designates a common chamber constituting the device main body and numeral 12 designates a transfer mechanism for transferring the substrate 10. The substrate 10 is transferred in and transferred out to and from load lock chambers 13 and 14 attached to the device main body 11. Further, numerals 15 and 16 designate substrate transfer cassettes installed to the load lock chambers 13 and 14. Further, the load lock chambers 13 and 14 can sealingly be shielded from the common chamber 11 by gate valves 17 and 18.

The common chamber 11 is installed with a first reaction chamber 19, a second reaction chamber 20 and a third reaction chamber 21 and the respectives of the first through the third reaction chambers can sealingly be shielded from the common chamber 11 by gate valves 22, 23 and 24. Further, the respectives of the first through the third reaction chambers are provided with vacuum exhaust pumps (not illustrated) which can reduce pressure down to ultra high vacuum ($1\times10^{-8}$ torr or lower, preferably, $1\times10^{-9}$ torr or lower).

Further, numeral 25 designates a heating chamber which is chamber for performing the heating treatment in the reflow step. It is preferable that the heating chamber is provided with a constitution capable of performing the RTA processing in consideration of the throughput. Naturally, a plasma generating mechanism may be provided for generating hydrogen radical described in Embodiment 5. Incidentally, the heating chamber 25 and the common chamber 11 can also be sealingly shielded from each other by a gate valve 26.

Here, FIG. 5(B) shows an outline of a section cut by a broken line in respect of the sputtering device shown by FIG. 5(A). Incidentally, a further detailed explanation will be given of a schematic view shown by FIG. 5(A) and therefore, a section of FIG. 5(B) does not necessarily coincide with a section of FIG. 5(A), however, the explanation will be given basically of the same sputtering device.

The transfer mechanism 12 arranged in the common chamber 11 is movable in the up and down direction and in the left and right direction and transfers the substrate 10 to the reaction chambers 19 through 21 or the heating chamber 25. Here, caution is required to the fact that the transfer mechanism 12 is of a face down type where the substrate 10 is always transferred with the main surface (face for forming device) directed downwardly. This system is preferable in reducing adhesion of dirt to the substrate 10. Naturally, a face up system for directing the main surface of the substrate upwardly may be used.

The reaction chamber 21 is constituted by a target support base 31, a target 32, a shutter 33 and a substrate holder 34. The face down type is adopted in the substrate holder 34 and therefore, it is designed that only several millimeters of an end portion of the substrate 10 is supported and the surface of the substrate is not contaminated. Otherwise, the face up type or a type for forming film by vertically placing the substrate or the like can be used.

The heating chamber 25 is constituted by a substrate holder 35 and heating lamps 36 and 37. The substrate holder 35 also adopts the face down type. Further, heating can be carried out from both faces of the substrate 10 by the couple of heating lamp 36 and 37. In the case of the device, the heating lamp 37 constitutes a main lamp for heating a side of the main surface. Naturally, the face up type or the like may be used.

Next, an example of forming a laminated structure comprising thin films having different compositions by using the sputtering device constituted as described above, will be shown.

For example, a first reaction chamber 19 is provided with an Al (or Al—Si, Al—Si—Cu or the like) target, the second reaction chamber 20 is provided with a Ge (or Sn, Ga or the like) target and the third reaction chamber 21 is provided with a Ti (or TiN or the like) target. Then, a Ti—Al—Ge laminated structure or a Ti—Al—Ge—Ti laminated structure or the like can be provided by carrying out film formation by using the respective targets continuously without being opened to an atmosphere.

Increase or reduction of the number of reaction chambers as necessary can freely be carried out by a person executing the process and, for example, a Ti—Al—Ge—Sn laminated structure or the like can be provided by constituting a device having a first through a fourth reaction chamber.

In the reflow step, the surface shape and surface condition of a metal thin film subjected to the reflow process are important factors significantly influencing on the reflow step. For example, in an atmosphere, natural oxides are immediately formed on the thin film surface including aluminum as a major component and the natural oxides constitute a factor for hampering the reflow process. Further, the natural oxides are insulating and therefore, the natural oxides hamper also the ohmic contact with other conductive thin films.

However, according to the embodiment, metal thin films having different compositions can be laminated without being exposed in an atmosphere and therefore, the above-described problems are not caused. Particularly, the surface of aluminum is liable to oxidize and therefore, the effect of the embodiment capable of laminating metal thin films without being opened to an atmosphere is very effective.

[Embodiment 8]

The present invention is applicable to all the semiconductor devices where wiring structures are needed. Hence, the present invention is applicable to semiconductor devices of an insulating gate type transistor as well as a thin film diode, a bipolar transistor, a thyristor, an electrostatic induction type transistor and the like.

Incidentally, semiconductor devices in the specification are referred to as general devices functioning by utilizing semiconductors and include in the category also electro-optic devices (liquid crystal display device, EL display device, EC display device and the like) of a transmitting type or a reflecting type constituted by various above-described semiconductor devices and applied products integrated with such electro-optic devices.

According to the embodiment, an explanation will be given of the applied products in reference to illustrated examples. As semiconductor devices utilizing the present invention, a TV camera, a head mount display, a car navigation system, a projection (front type and rear type) system, a video camera, a personal computer and the like are pointed out. A simple explanation will be given in reference to FIGS. 6(A), 6(B), 6(C), 6(D), 6(E) and 6(F).

Figure 6A:
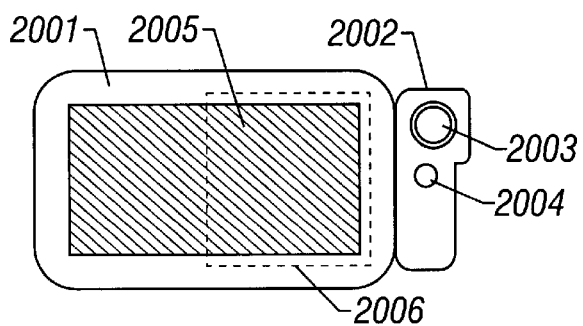

FIG. 6(A) shows a mobile computer which is constituted by a main body 2001, a camera unit 2002, an image receiving unit 2003, an operation switch 2004 and a display device 2005. The present invention is applied to the display device 2005 and an integrated circuit 2006 integrated in the inside of the mobile computer.

Figure 6B:
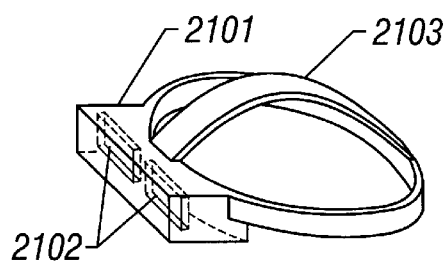

FIG. 6(B) shows a head mount display which is constituted by a main body 2101, a display device 2102 and a band unit 2103. Two sheets having a comparatively small size are used for the display device 2102.

Figure 6C:
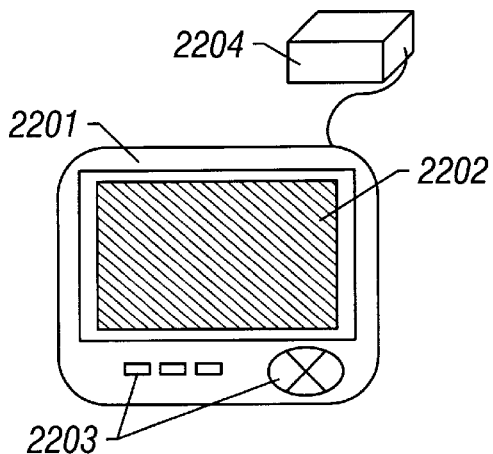

FIG. 6(C) designates a car navigation system which is constituted by a main body 2201, a display device 2202, operation switches 2203 and an antenna 2204. The present invention is applicable to the display device 2202 and an integrated circuit at the inside of the device. The display device 2202 is utilized as a monitor in which the resolution of the allowable range is comparably wide since the main purpose of the device is display of a map.

Figure 6D:
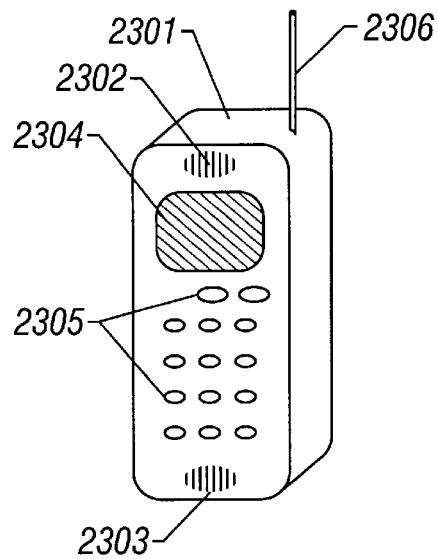

FIG. 6(D) is a portable telephone which is constituted by a main body 2301, a voice output unit 2302, a voice input unit 2303, a display device 2304, operation switches 2305 and an antenna 2306. The present invention is applicable to the display device 2304 and an integrated circuit at the inside of the device.

Figure 6E:
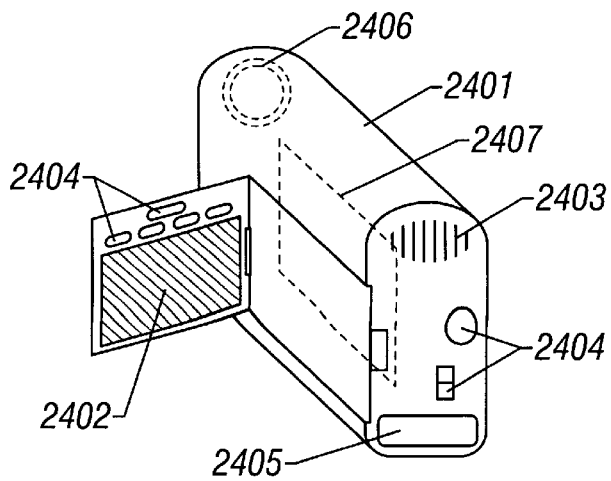

FIG. 6(E) shows a video camera, which is constituted by a main body 2401, a display device 2402, a voice input unit 2403, operation switches 2404, a battery 2405 and an image receiving unit 2406. The present invention is applicable to the display device 2402 and an integrated circuit 2407 at the inside of the device.

Figure 6F:
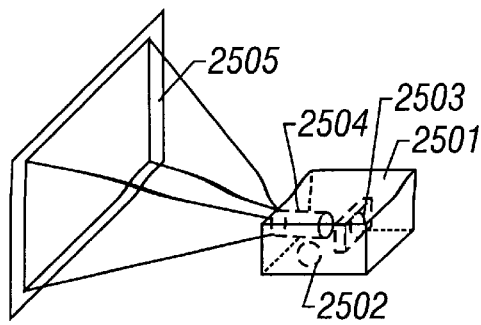

FIG. 6(F) shows a front projection system which is constituted by a main body 2501, a light source 2502, a reflecting type display device 2503, an optical system (including a beam splitter, a reflector and the like) 2504 and a screen 2505. The screen 2505 is a large screen utilized in presentation at conferences, academic societies and the like and accordingly, high resolution is required to the display device 2503.

Further, other than the electro-optic devices shown in the embodiment, the present invention is applicable to a rear projection system or portable information terminal devices of handy terminals or the like. As described above, the range of application of the present invention is extremely wide and the present invention is applicable to display media in all the fields.

In forming contact for a wiring electrode including aluminum as a major component, by carrying out a reflow step using an element belonging to 12 through 15 groups, firm contact can be formed by the operation of the element. As a result, excellent contact can be achieved in semiconductor devices of all the structures and the reliability of the semiconductor devices can significantly be promoted.

Further, in that case, the reflow step can be carried out at low temperatures of 400° C. or lower, representatively, 350 through 400° C. and therefore, thermal deterioration of wirings of other layers and insulating films caused by the reflow step can be prevented. Further, in fabricating a semiconductor device having a multi layer wiring structure, the width of selecting material for use of an insulating film can be widened.

What is claimed is:

1. A method of fabricating a semiconductor device including a structure having a conductive material and an insulating film formed on the conductive material comprising:
   a step of forming a contact hole in the insulating film and exposing the conductive material at a bottom thereof;
   a step of forming a wiring material comprising aluminum or including aluminum as a major component which is brought into electrical contact with the conductive material at least at the bottom of the contact hole;
   a step of forming a film including an element selected from the group consisting of 12 through 15 group elements as a major component on a surface of the wiring material; and
   a step of fluidizing the wiring material by a heating treatment,
   wherein the heating treatment is carried out at a temperature of 400° C. or lower in an atmosphere including hydrogen.

2. A method of fabricating a semiconductor device including a structure having a conductive material and an insulating film formed on the conductive material comprising at least:
   a step of forming a contact hole in the insulating film and exposing the conductive material at a bottom thereof;
   a step of forming a titanium film which is brought into contact with the conductive material at least at the bottom of the contact hole;
   a step of forming a wiring material comprising aluminum or including aluminum as a major component which is brought into contact with a surface of the titanium film;
   a step of forming a film including an element selected from the group consisting of 12 through 15 group elements as a major component on a surface of the wiring material; and
   a step of fluidizing the wiring material by a heating treatment,
   wherein the heating treatment is carried out at a temperature of 400° C. or lower in an atmosphere including hydrogen.

3. A step of forming a semiconductor device having a multi layer wiring structure constituted by laminating a wiring comprising a conductive material and an insulating film comprising an organic resin material, comprising:
   a step of forming a contact hole in the insulating film and exposing the conductive material at a bottom thereof;
   a step of forming a wiring material comprising aluminum or including aluminum as a major component which is brought into electrical contact with the conductive material at least at the bottom of the contact hole;
   a step of forming a film including an element selected from the group consisting of 12 through 15 group elements as a major component on a surface of the wiring material; and
   a step of fluidizing the wiring material by a heating treatment,
   wherein the heating treatment is carried out at a temperature of 400° C. or lower in an atmosphere including hydrogen.

4. A method of fabricating a semiconductor device including a structure having a conductive material and an insulating film formed on the conductive material comprising at least:
   a step of forming a contact hole in the insulating film comprising a resin material and exposing the conductive material at a bottom thereof;
   a step of forming a wiring material comprising aluminum or including aluminum as a major component which is brought into electrical contact with the conductive material at least at the bottom of the contact hole;
   a step of forming a film including an element selected from the group consisting of 12 through 15 group elements as a major component on a surface of the wiring material; and
   a step of fluidizing the wiring material by a heating treatment,
   wherein the heating treatment is carried out by RTA (rapid thermal annealing) in an atmosphere including hydrogen.

5. A method of fabricating a semiconductor device including a structure having a conductive material and an insulating film formed on the conductive material comprising at least:
   a step of forming a contact hole in the insulating film comprising a resin material and exposing the conductive material at a bottom thereof;
   a step of forming a titanium film which is brought into contact with the conductive material at least at the bottom of the contact hole;
   a step of forming a wiring material comprising aluminum or including aluminum as a major component which is brought into contact with a surface of the titanium film;
   a step of forming a film including an element selected from the group consisting of 12 through 15 group elements as a major component on a surface of the wiring material; and
   a step of fluidizing the wiring material by a heating treatment,
   wherein the heating treatment is carried out by RTA (rapid thermal annealing) in an atmosphere including hydrogen.

6. A step of forming a semiconductor device having a multi layer wiring structure constituted by laminating a wiring comprising a conductive material and an insulating film comprising an organic resin material, comprising:

a step of forming a contact hole in the insulating film and exposing the conductive material at a bottom thereof;

a step of forming a wiring material comprising aluminum or including aluminum as a major component which is brought into electrical contact with the conductive material at least at the bottom of the contact hole;

a step of forming a film including an element selected from the group consisting of 12 through 15 group elements as a major component on a surface of the wiring material; and a step of fluidizing the wiring material by a heating treatment, wherein the heating treatment is carried out by RTA (rapid thermal annealing) in an atmosphere including hydrogen.

7. A method according to any one of claim 1 through claim 6, wherein the wiring material and the film including the element belonging to 12 through 15 groups as a major component are continuously laminated without being opened to an atmosphere.

8. A method according to any one of claim 1 through claim 6, wherein the conductive material is aluminum or a material including aluminum as a major component or a conductive semiconductor material.

9. A method according to any one of claim 1 through claim 6, wherein one or a plurality of kinds of the element selected from the group consisting of Germanium, Tin, Gallium, Lead, Zinc, Indium and Antimony are used as the element belonging to 12 through 15 groups.

10. A method according to any one of claim 1 through claim 6, wherein the insulating film comprises a permeable organic resin material.

11. A method according to any one of claim 1 through claim 6, wherein radical and/or ionic hydrogen excited by a plasma is present in the atmosphere including hydrogen.

12. A method according to any one of claim 1 through claim 6, wherein an oxygen concentration of the wiring material comprising aluminum or including aluminum as a major component is $5 \times 10^{19}$ atoms/cm$^3$ or lower.

13. A method according to any one of claim 1 through claim 6, wherein the insulating film comprises a permeable organic resin material and the wiring material is fluidized on a flat face provided by the permeable organic resin material.

14. A method according to claim 1, wherein said semiconductor device is an EL display device.

15. A method according to claim 2, wherein said semiconductor device is an EL display device.

16. A method according to claim 3, wherein said semiconductor device is an EL display device.

17. A method according to claim 4, wherein said semiconductor device is an EL display device.

18. A method according to claim 5, wherein said semiconductor device is an EL display device.

19. A method according to claim 6, wherein said semiconductor device is an EL display device.

20. A method according to claim 1, wherein said semiconductor device is a mobile computer, a head mount display, a car navigation system, a portable telephone, a video camera, or a projection.

21. A method according to claim 2, wherein said semiconductor device is a mobile computer, a head mount display, a car navigation system, a portable telephone, a video camera, or a projection.

22. A method according to claim 3, wherein said semiconductor device is a mobile computer, a head mount display, a car navigation system, a portable telephone, a video camera, or a projection.

23. A method according to claim 4, wherein said semiconductor device is a mobile computer, a head mount display, a car navigation system, a portable telephone, a video camera, or a projection.

24. A method according to claim 5, wherein said semiconductor device is a mobile computer, a head mount display, a car navigation system, a portable telephone, a video camera, or a projection.

25. A method according to claim 6, wherein said semiconductor device is a mobile computer, a head mount display, a car navigation system, a portable telephone, a video camera, or a projection.

26. A method of fabricating a semiconductor device comprising:

forming a first conductive layer over a substrate;

forming an insulating film comprising a resin material over said first conductive layer;

forming at least one contact hole in said insulating film to expose a portion of said first conductive layer in said contact hole;

forming a second conductive layer comprising aluminum on said insulating film and in said contact hole;

forming a film containing an element belonging to 12 through 15 groups in contact with said second conductive layer; and heating said second conductive layer and said film to flow sa id second conductive layer.

27. A method according to claim 26, wherein said heating step is performed at a temperature of 400° C. or lower.

28. A method according to claim 26, wherein said heating step is performed at a temperature of 350° C. or lower.

29. A method according to claim 26, wherein said heating step is performed in an atmosphere including hydrogen.

30. A method according to claim 26, wherein said resin material is one selected from the group consisting of polyimide, polyamide and polyimide amide.

31. A method according to claim 26, further comprising a step of forming another film comprising titanium between said insulating film and said second conductive layer.

32. A method according to claim 26, wherein an oxygen concentration of said second conductive layer is $5 \times 10^{19}$ atoms/cm$^3$ or lower.

33. A method according to claim 26, wherein said semiconductor device is an EL display device.

34. A method according to claim 26, wherein said semiconductor device is a mobile computer, a head mount display, a car navigation system, a portable telephone, a video camera, or a projection.

35. A method of fabricating a semiconductor device comprising:

forming a thin-film transistor over a substrate;

forming a first insulating film comprising a resin material over said thin-film transistor;

forming at least one contact hole in said first insulating film;

forming a conductive film comprising aluminum on said first insulating film and in said contact hole;

forming a film including an element selected from the group consisting of 12 through 15 group elements in contact with said conductive film; and heating said conductive film and said film to flow said conductive film in order that said conductive film is electrically connected with said thin-film transistor through said contact hole.

36. A method according to claim 35, wherein said heating step is performed at a temperature of 400° C. or lower.

37. A method according to claim 35, wherein said heating step is performed at a temperature of 350° C. or lower.

38. A method according to claim 35, wherein said heating step is performed in an atmosphere including hydrogen.

39. A method according to claim 35, wherein said resin material is one selected from the group consisting of polyimide, polyamide and polyimide amide.

40. A method according to claim 36, further comprising a step of forming another film comprising titanium between said first insulating film and said conductive film.

41. A method according to claim 36, wherein an oxygen concentration of said conductive film is $5 \times 10^{19}$ atoms/cm$^3$ or lower.

42. A method according to claim 36, wherein said semiconductor device is an EL display device.

43. A method according to claim 36, wherein said semiconductor device is a mobile computer, a head mount display, a car navigation system, a portable telephone, a video camera, or a projection.

44. A method of fabricating a semiconductor device comprising:

forming at least one transistor in a semiconductor substrate;

forming at least one first insulating film over said substrate;

forming a thin-film transistor over said first insulating films;

forming a second insulating film over said thin film transistor;

forming at least one contact hole through said first and second insulating film;

forming a wiring material comprising aluminum on said second insulating film so that said wiring material is formed in said contact hole;

forming a film containing an element selected from the group consisting of 12 through 15 group elements in contact with said wiring material; and heating said wiring material and said film to flow said wiring material, wherein said wiring material is electrically connected with said transistor through said contact hole.

45. A method according to claim 44, wherein said transistor is a bipolar-transistor.

46. A method according to claim 44, further comprising a step of forming another insulating film and another wiring material between said first insulating film and said semiconductor substrate.

47. A method according to claim 44, wherein said heating step is performed at a temperature of 400° C. or lower.

48. A method according to claim 44, wherein said heating step is performed at a temperature of 350° C. or lower.

49. A method according to claim 44, wherein said heating step is performed in an atmosphere including hydrogen.

50. A method according to claim 44, further comprising a step of forming another film comprising titanium between said second insulating film and said second wiring material.

51. A method according to claim 44, wherein an oxygen concentration of said second wiring material is $5 \times 10^{19}$ atoms/cm$^3$ or lower.

52. A method according to claim 44, wherein said semiconductor device is an EL display device.

53. A method according to claim 44, wherein said semiconductor device is a mobile computer, a head mount display, a car navigation system, a portable telephone, a video camera, or a projection.

* * * * *